(12) United States Patent
Yanashima et al.

(10) Patent No.: US 6,730,611 B2
(45) Date of Patent: May 4, 2004

(54) NITRIDE SEMICONDUCTOR GROWING PROCESS

(75) Inventors: Katsunori Yanashima, Kanagawa (JP); Hiroshi Nakajima, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/216,400

(22) Filed: Aug. 12, 2002

(65) Prior Publication Data

US 2003/0038302 A1 Feb. 27, 2003

(30) Foreign Application Priority Data

Aug. 13, 2001 (JP) .................................. P2001-245134

(51) Int. Cl.[7] .......................................... H01L 21/302
(52) U.S. Cl. ....................................................... 438/724
(58) Field of Search ............................................... 438/8

(56) References Cited

U.S. PATENT DOCUMENTS 5,637,531 A * 6/1997 Porowski et al. ............. 117/89
5,909,036 A * 6/1999 Tanaka et al. ................ 257/94

* cited by examiner

*Primary Examiner*—David Nelms
*Assistant Examiner*—Thao P. Le
(74) *Attorney, Agent, or Firm*—Rader, Fishman & Grauer PLLC; Ronald P. Kananen

(57) ABSTRACT

A process of growing a nitride semiconductor on a crystalline nitride semiconductor substrate is disclosed, which is carried out by heating the substrate and initiating supply of source gases onto a surface of the substrate before the substrate temperature exceeds 1200° C., to initiate growth of the nitride semiconductor on the substrate. The nitride semiconductor growth is initiated after the substrate temperature has reached 300° C., and also after supply of a nitrogen source gas has been initiated and before the substrate temperature exceeds 1200° C.

13 Claims, 13 Drawing Sheets

NITRIDE SEMICONDUCTOR GROWING PROCESS

CROSS REFERENCE TO RELATED APPLICATIONS

This application claims priority to Japanese Patent Application No. JP 2001-245134, filed on Aug. 13, 2001, the disclosure of such application being herein incorporated by reference to the extent permitted by law.

BACKGROUND OF THE INVENTION

1. Field of the Invention

The present invention relates to a process of growing a nitride semiconductor and particularly to a process of growing a nitride semiconductor on a nitride semiconductor substrate.

2. Description of Related Art

Nitride semiconductors used in light-emitting devices such as light-emitting diodes and laser diodes, or light-receiving devices such as optical sensors are fabricated by growth on substrates of different materials other than nitride, such as sapphire or silicon carbide.

In some conventional fabrication processes of this kind, a low-temperature amorphous gallium nitride buffer layer is formed on a sapphire or silicon carbide substrate, and then a crystalline nitride semiconductor is grown on the buffer layer. Also, to prevent dislocation defects, the nitride semiconductor on the low-temperature buffer layer is etched in a stripe form for re-growth into another nitride semiconductor. These processes take advantage of the fact that dislocations do not significantly propagate laterally from the underlying nitride semiconductor, i.e., that the re-grown lateral nitride semiconductor is relatively dislocation-free.

Even under the above fabrication process, however, the dislocation problem associated with the growth of nitride semiconductors has not been satisfactorily solved.

Under such situation, thanks to progress in growth processes such as hydride vapor phase epitaxy and metal organic chemical vapor deposition, relatively thick nitride semiconductor crystalline substrates can be fabricated. If nitride semiconductors are grown on these crystalline substrates, the dislocations and other defects will be reduced and cleavage and thermal conductivity may be improved, thus making it expectable to fabricate nitride semiconductors with better crystallinity.

However, conditions for growing nitride semiconductors of optimum characteristics on crystalline nitride semiconductor substrates have not been established yet.

SUMMARY OF THE INVENTION

In order to satisfy the above and other needs, the present invention provides a nitride semiconductor growth process which is capable of growing on a crystalline nitride semiconductor substrate a nitride semiconductor having satisfactory crystalline conditions suitable for electronic applications including but not limited to light-emitting and light-receiving devices.

According to a first preferred embodiment of the present invention, a process of growing a nitride semiconductor on a crystalline nitride semiconductor substrate is carried out by heating the substrate and initiating a supply of source gases onto a surface of the substrate before the temperature of the substrate exceeds 1200° C. to initiate growth of the nitride semiconductor on the substrate.

According to this preferred embodiment of the present invention, even when the growth temperature for the nitride semiconductor is set at 1200° C. or higher, the growth of the nitride semiconductor on the substrate can be initiated when the substrate temperature has reached at least 1200° C. This permits the nitride semiconductor growth to start on the substrate surface before development of roughness on that surface due to desorption of nitride semiconductor material from that surface, thereby implementing the nitride semiconductor growth on the substrate having satisfactory surface conditions.

In another preferred embodiment of the present invention, a process of growing a nitride semiconductor on a crystalline nitride semiconductor substrate is carried out by heating the substrate to a temperature not exceeding 1200° C. to subject a surface of the substrate to thermal cleaning, and thereafter initiating growth of the nitride semiconductor on the substrate.

According to this preferred embodiment of the present invention, the substrate is thermally cleaned at a temperature not higher than 1200° C., while preventing desorption of nitride semiconductor material from its surface. Thus, the thermal cleaning removes oxides from the substrate surface, while preventing desorption of nitride semiconductor material therefrom to keep the substrate in satisfactory surface conditions, thereby allowing the nitride semiconductor growth to start on the optimized substrate surface.

BRIEF DESCRIPTION OF THE DRAWINGS

The above and other objects, features and advantages of the present invention will become more apparent from the following description of the presently preferred exemplary preferred embodiment of the present invention taken in conjunction with the accompanying drawings, in which.

DESCRIPTION OF THE PREFERRED EMBODIMENTS

A process of growing nitride semiconductors according to a preferred embodiment of the present invention are to be described in detail with reference to the drawings. The following preferred embodiments of the present invention refer to the process of growing gallium nitride (GaN) as the nitride semiconductors.

Figure 1:
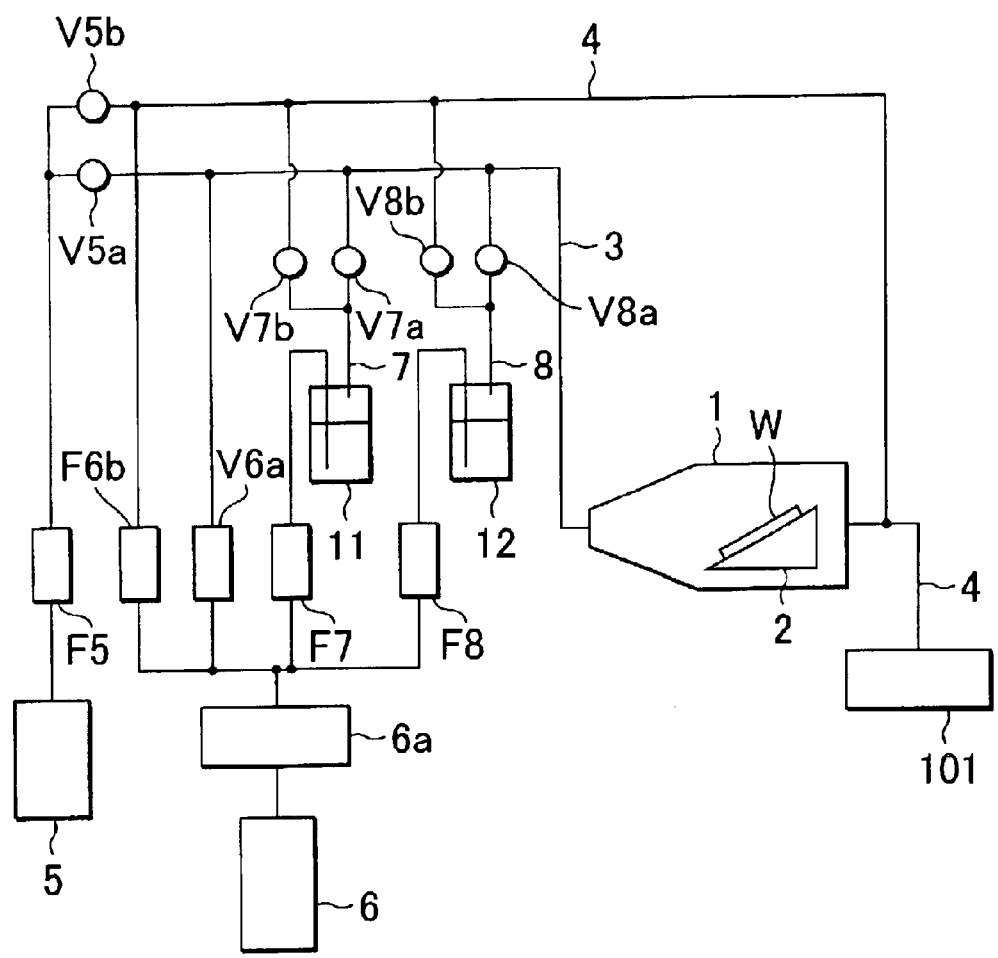
FIG. 1 is a schematic diagram showing an example of a MOCVD apparatus used in a process of growing nitride semiconductors according to a preferred embodiment of the present invention.

FIG. 1 is a schematic diagram showing an example of a MOCVD (Metal Organic CVD) system used in growing nitride semiconductors, according to a preferred embodiment of the present invention. This MOCVD apparatus includes a reactor tube 1 that houses a substrate W disposed on a susceptor 2 so that the substrate W is processed to grow a nitride semiconductor thereon. In the reactor tube 1, the atmosphere and the temperature of the substrate W as disposed on the susceptor 2 can be controlled. The reactor tube 1, to which a main supply line 3 and a vent line 4 are connected, is supplied with gases through the main supply line 3 and discharges the gases through the vent line 4. The vent line 4 is also connected to a harm eliminator unit 101.

Connected to both the main supply line 3 and the vent line 4 are an ammonia gas supply means 5 for supplying ammonia gas as a nitrogen (N) source, a hydrogen gas supply means 6, a first supply conduit 7 for supplying trimethylgallium (TMG) as a gallium (Ga) source, and a second supply conduit 8 for supplying tetraethylsilane as a silicon (Si) source. It should be noted that silicon is used as an n-type impurity to be introduced into gallium nitride.

The ammonia gas supply means 5 is connected to the main supply line 3 and the vent line 4 through valves V5a and V5b, and has a mass flow controller F5 arranged upstream of these valves V5a and V5b.

In addition, the hydrogen gas supply means 6 is provided with a hydrogen purifier 6a that is connected to the main supply line 3 and the vent line 4 through mass flow controllers F6a and F6b, respectively.

The first supply conduit 7 is connected to the main supply line 3 and the vent line 4 through valves V7a and V7b. The first supply conduit 7 is also connected to a bubbler 11 containing a liquid source (TMG in the preferred embodiment of the present invention to be disclosed below). A branch conduit from the hydrogen gas purifier 6a connects with the bubbler 11 through a mass flow controller F7, with its end dipped into TMG.

Similarly, the second supply conduit 8 is connected to the main supply line 3 and the vent line 4 through valves V8a and V8b. The second supply conduit 8 is also connected to a bubbler 12 storing another liquid source (tetraethylsilane in the preferred embodiment of the present invention to be disclosed below). Another branch conduit from the hydrogen gas purifier 6a connects with the bubbler 12 through a mass flow controller F8, with its end dipped into tetraethylsilane.

In the MOCVD apparatus having the above configuration, ammonia is fed from the ammonia gas supply means 5 into the reactor tube 1 along the main supply line 3 via proper switching of the valves 5a and 5b, with its flow rate controlled by the mass flow controller F5.

Highly purified hydrogen gas is also supplied from the hydrogen purifier 6a to the reactor tube 1 through the main supply line 3 with its flow rate controlled by the mass flow controller F6a. The hydrogen gas is also supplied to the vent line 4 with its flow rate controlled by the mass flow controller F6b.

The highly purified hydrogen gas from the hydrogen purifier 6a is further supplied to the liquids (TMG and tetraethylsilane) in the bubblers 11 and 12, respectively, as a carrier gas. As the hydrogen gas bubbles through these liquids in the respective bubblers, source gases are produced in amounts commensurate with the vapor pressures of these liquids, and the produced source gases are delivered by the hydrogen carrier gas to the main supply line 3 and further to the reactor tube 1 through the first and second supply conduits 7 and 8. The amount of each source gas produced is controlled by adjustment of the flow rate of the hydrogen gas through the relevant mass flow controller F7 or F8 disposed along the branch conduit of the hydrogen purifier 6a. The source gas produced by the bubbler 11 and collected into the first supply conduit 7 is supplied to both the main supply line 3 and the vent line 4 via proper switching of the valves 7a and 7b. The source gas generated by the bubbler 12 and collected into the second supply conduit 8 is likewise supplied to both the main supply line 3 and the vent line 4 via proper switching of the valves 8a and 8b.

The substrate W, which is to be processed, is held on the susceptor 2 at a prescribed temperature inside the reactor tube 1, and is supplied with the above-mentioned flow rate-adjusted source gases for processing.

To incorporate boron (B) into gallium nitride as the nitride semiconductor, triethylboron is used as a liquid source to produce a boron source gas. To introduce aluminum (Al) into the nitride semiconductor, trimethylaluminum is used as a liquid source for an aluminum source gas. To introduce indium (In) into the nitride semiconductor, trimethylindium is used as a liquid source to produce an indium source gas. These liquid materials are contained in bubblers similarly to TMG for the gallium source gas, and fed into the reactor tube 1 together with the carrier gas (hydrogen in the preferred embodiment of the present invention to be described below). The liquid materials to be used are not limited to the above, but include others capable of supplying group III source gases selected according to the composition of a desired nitride semiconductor. While tetraethylsilane is used as the silicon (Si) source gas in the preferred embodiment of the present invention to be described below, other gases such as monosilane and disilane may also be used.

(First Preferred Embodiment of the Present Invention)

Figure 2:
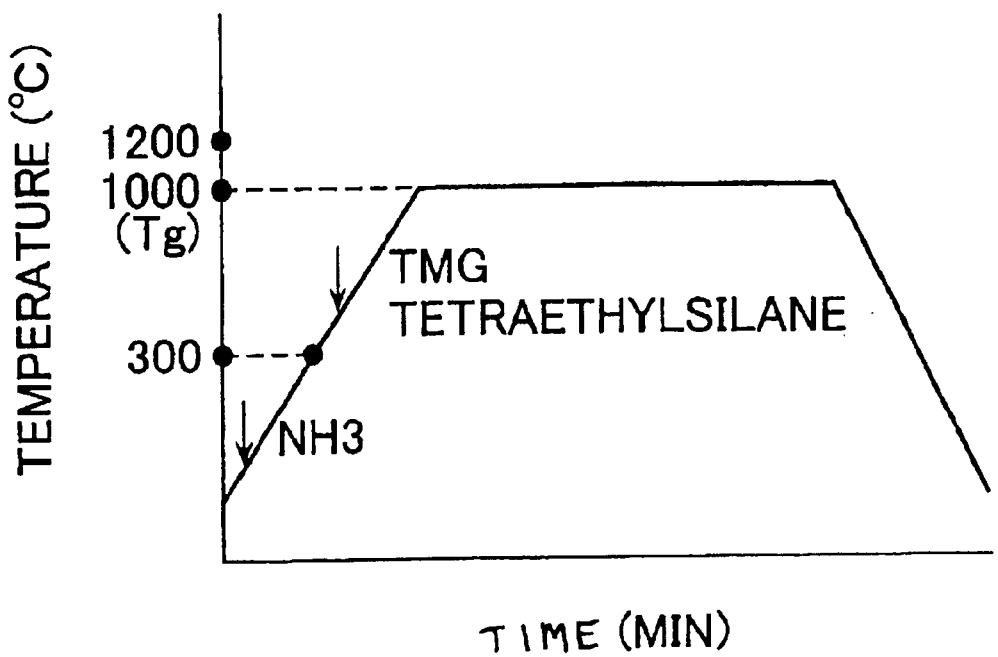
FIG. 2 is a graph showing an example of a substrate temperature sequence for explaining a process of growing a nitride semiconductor according to a first preferred embodiment of the present invention.

FIG. 2 is a graph showing an example of a temperature sequence for a substrate as a function of the timing for supplying source gases according to a first preferred embodiment of the present invention. Referring to this graph and FIG. 1, a process of growing a nitride semiconductor according to the first preferred embodiment of the present invention is described below.

First, in the MOCVD apparatus, the reactor tube 1 is closed after the substrate W is fixed onto the susceptor 2. The substrate W is a nitride semiconductor substrate made either of crystalline gallium nitride or by forming a crystalline gallium nitride layer on a substrate of a different type, such as sapphire.

Next, the reactor tube 1 is heated to start heating the substrate W, and an ammonia gas ($NH_3$) flow or supply into the tube 1 is also started. The ammonia gas flow may start before (i.e., when the reactor tube 1 stays at room temperature) or after the substrate W is heated to a certain temperature.

In the reactor tube 1 into which ammonia is continuously supplied, the substrate W is further heated to and maintained at a growth temperature Tg (at which crystal growth can proceed stably for a certain time period) so that a nitride semiconductor is formed on the substrate W surface. For example, in order to grow gallium nitride on the surface of a crystalline gallium nitride substrate W, the growth temperature Tg is set in a range between 900° C. and 1300° C., or more preferably between 1000° C. and 1200° C. In this example, the growth temperature Tg is set at 1100° C., and the substrate W is heated to that temperature at a prescribed rate.

It is of particular note that a TMG (gallium source) flow is started after the ammonia flow has started and before the substrate W temperature reaches 1200° C., whereby the required source gases (nitrogen and group III source gases) are supplied to the reactor tube 1, to initiate the nitride semiconductor growth on the substrate surface in such a condition (monocrystalline, polycrystalline or amorphous) as determined by a material supply starting temperature, which is a substrate temperature at which to start supplying a relevant source gas onto the substrate. Here, the introduction of the group III material to the substrate W initiates the nitride semiconductor growth on the substrate W, and hence a group III material supply starting temperature Ts means a growth starting temperature Ts. The growth starting temperature (group III material supply starting temperature) Ts may be the same as the growth temperature Tg, although both temperatures Ts and Tg are not usually set to the same value.

Since the substrate W is heated up to 1100° C. in this example, the TMG flow should start either simultaneously with or after the ammonia flow. However, if the temperature of the substrate W is controlled at 1200° C. or lower during the growth process involving a series of steps, it is preferable to start the TMG flow within 20 minutes after the substrate W has been heated to its prescribed growth temperature Tg.

It is also preferable to start the TMG flow after the substrate W has been heated to 300° C. It is more preferable to start the TMG flow when the substrate W is at a prescribed temperature (i.e., the group III material supply starting temperature and thus the growth starting temperature) Ts after heated to 400° C.

A flow of tetraethylsilane (the Si source serving as an impurity) into the reactor tube 1 is started simultaneously with the TMG flow.

The source gas flows are carried out, for example, at 10 slm (std. liter/minute, or liter/minute at standard conditions) for ammonia, 50 $\mu$mol/min for TMG, and $1.5\times10^{-3}$ $\mu$mol/min for tetraethylsilane.

As described above, upon start of the group III material (TMG) flow into the reactor tube 1, a nitride of the group III material (i.e., a nitride semiconductor) begins to grow in such a condition (monocrystalline, polycrystalline or amorphous) as determined by the corresponding group III material supply starting temperature (growth starting temperature) Ts.

Holding the substrate W at the prescribed growth temperature Tg (1100° C. in this example), the source gas flows are continued so that the nitride semiconductor growth proceeds on the surface of the substrate W. When the nitride semiconductor has grown to a predetermined thickness, the source gas flows are eliminated, and the substrate W is cooled, to terminate the growth process. During the cooling, ammonia as the nitride source may continuously be supplied.

Figure 3:
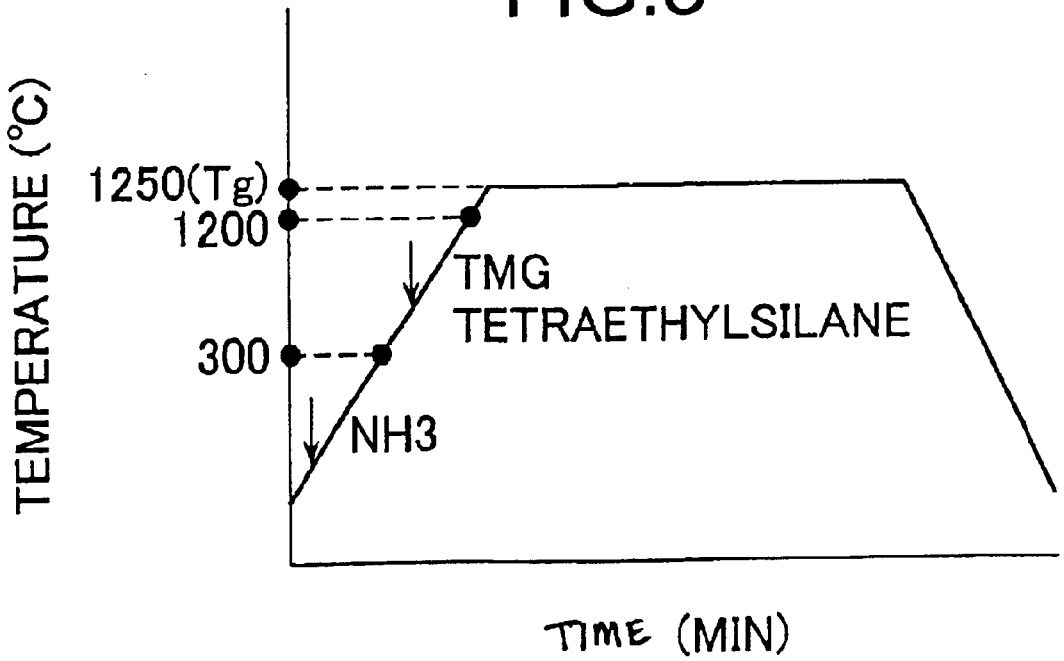
FIG. 3 is a graph showing another example of a substrate temperature sequence for explaining the process according to the first preferred embodiment of the present invention.

FIG. 3 is a graph showing another example of a temperature sequence for a substrate W according to the first preferred embodiment of the present invention. The growth temperature Tg is set at 1250° C. in this example. For a growth temperature Tg exceeding 1200° C., the TMG flow should be started while the substrate W is in a temperature range of 1200° C. or lower, before reaching the growth temperature Tg.

Figure 4:
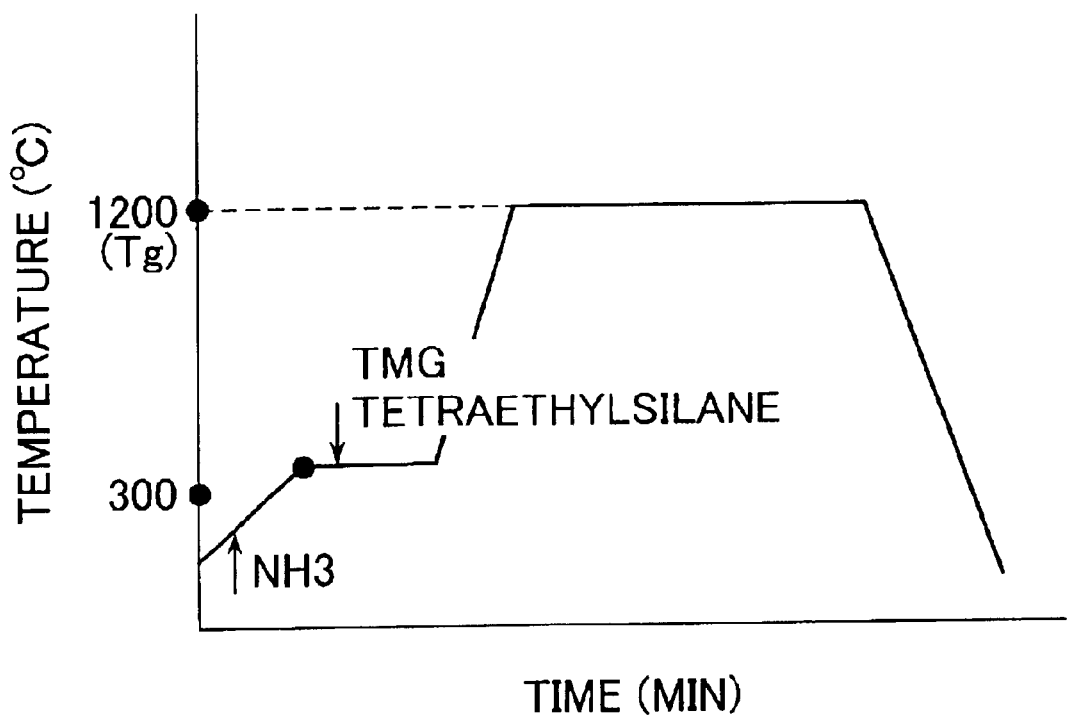
FIG. 4 is a graph showing still another example of a substrate temperature sequence for explaining the process according to the first preferred embodiment of the present invention.

The temperature sequence for heating the substrate W to its growth temperature Tg according to the first preferred embodiment of the present invention does not necessarily have to be linear as shown in FIG. 2 and FIG. 3, but may be steplike as shown in FIG. 4, in which a substrate W is temporarily held at a certain temperature for a certain period of time during heating. Still, another temperature sequence may be usable in which a substrate W is first heated over a growth temperature Tg and then cooled down to the growth temperature Tg. Even in this case, nitride semiconductor growth should start after the substrate temperature has reached 300° C. or preferably 400° C. and before it exceeds 1200° C. Furthermore, if the substrate temperature is controlled to 1200° C. or lower during the series of growth process steps, it is preferred to turn on the TMG flow into the reactor tube 1 within 20 minutes after the substrate W is heated to its growth temperature Tg.

As described above, according to the process of growing a nitride semiconductor, the substrate W is supplied with ammonia as the nitrogen source gas and with the other source gases before its temperature exceeds 1200° C. That is, the nitride semiconductor starts to grow on the surface of the substrate W before the substrate temperature exceeds 1200° C. This permits the nitride semiconductor growth to start before the substrate surface is heated to such an extent that the nitride semiconductor material is desorbed therefrom.

In the growth process during which the substrate W is kept at 1200° C. or lower, the flow of source gases other than the nitrogen source gas into the reactor tube 1 should begin within 20 minutes after the substrate W is heated to its growth temperature Tg, whereby the nitride semiconductor growth process can start on the substrate W surface before the substrate surface desorbs the nitride semiconductor source therefrom due to prolonged exposure to high-temperature atmosphere.

Therefore, the nitride semiconductor can be grown on the substrate W whose surface and crystalline conditions are well maintained, and this further allows formation on the substrate W of the nitride semiconductor having satisfactory surface and crystalline conditions.

As a result, it becomes possible to grow on the crystalline nitride semiconductor substrate, a nitride semiconductor having desirable surface and crystalline conditions and suitable for applications including light-emitting and light-receiving devices.

Figure 5:
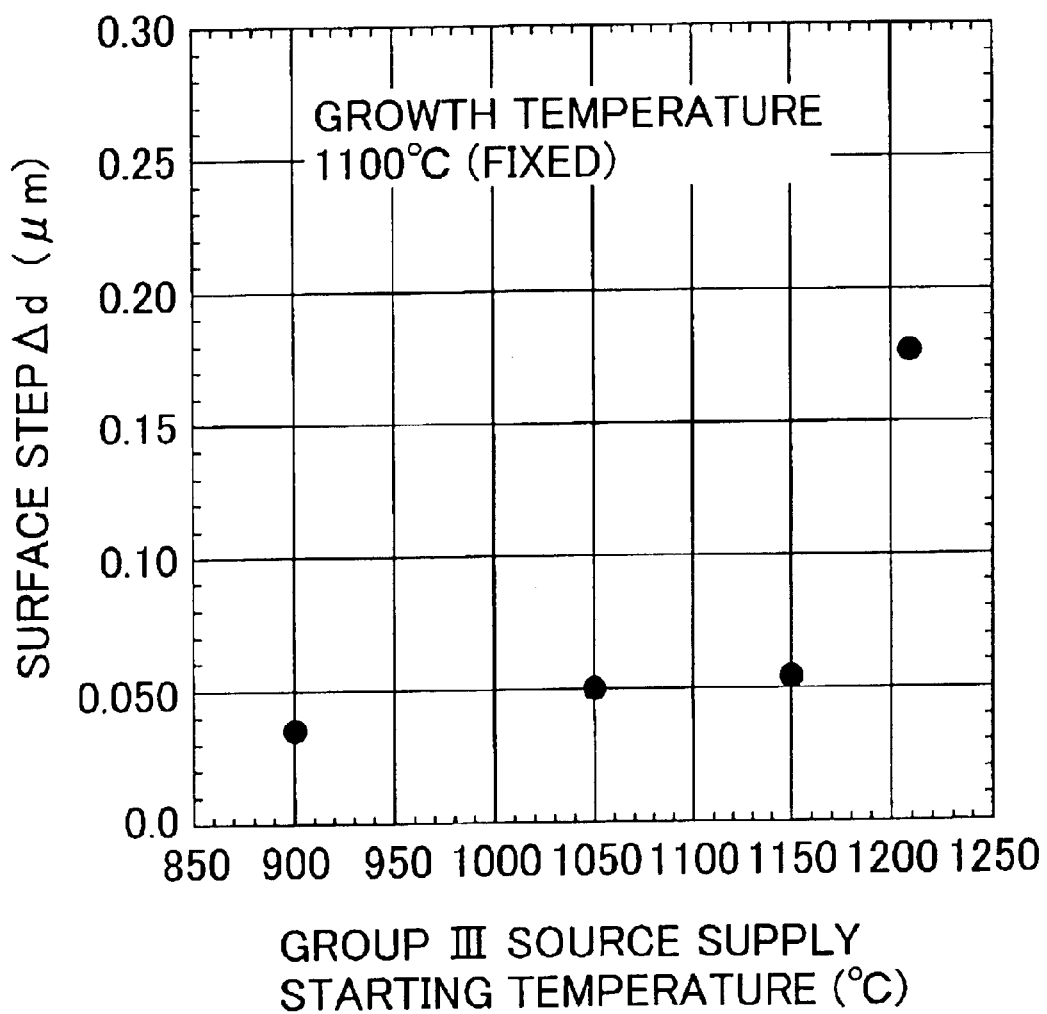
FIG. 5 is a graph showing TMG supply starting temperature versus surface roughness at a growth temperature Tg of 1100° C. in the first preferred embodiment of the present invention.
Figure 6:
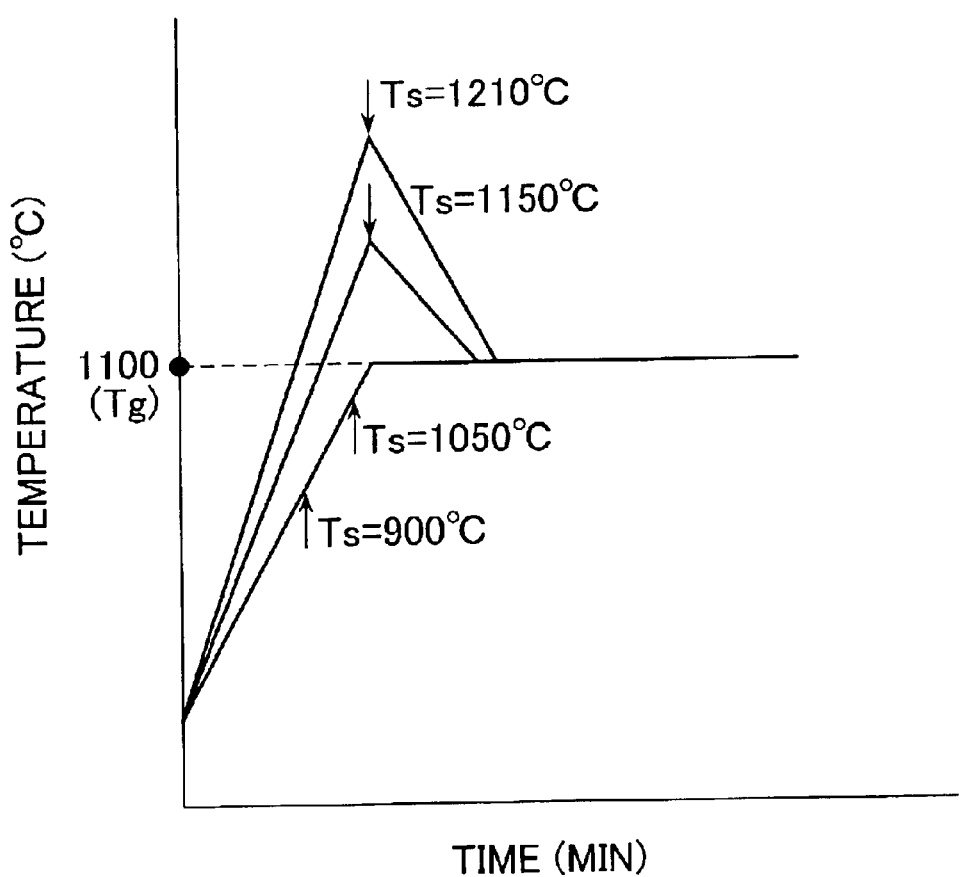
FIG. 6 shows a substrate temperature sequence used during nitride semiconductor growth to gather the data shown in the graph of FIG. 5.

FIG. 5 shows group III material supply starting temperature versus surface roughness (surface step) of nitride semiconductors formed on substrates W at their growth temperature Tg=1100° C. To gather the data plotted in FIG. 5, a temperature sequence shown in FIG. 6 was applied to the substrates W to grow the nitride semiconductors thereon. The data at Ts=900° C. and Ts=1050° C. were obtained from those substrates W that were supplied with TMG (group III source gas) at these temperatures (900° C. and 1050° C.) during heating to their growth temperature (Tg=1100° C.), while the data at Ts=1150° C. and Ts=1210° C. were obtained from the other substrates W that were supplied with TMG at 1150° C. and 1210° C. and then cooled down to their growth temperature (Tg=1100° C.).

Figure 7:
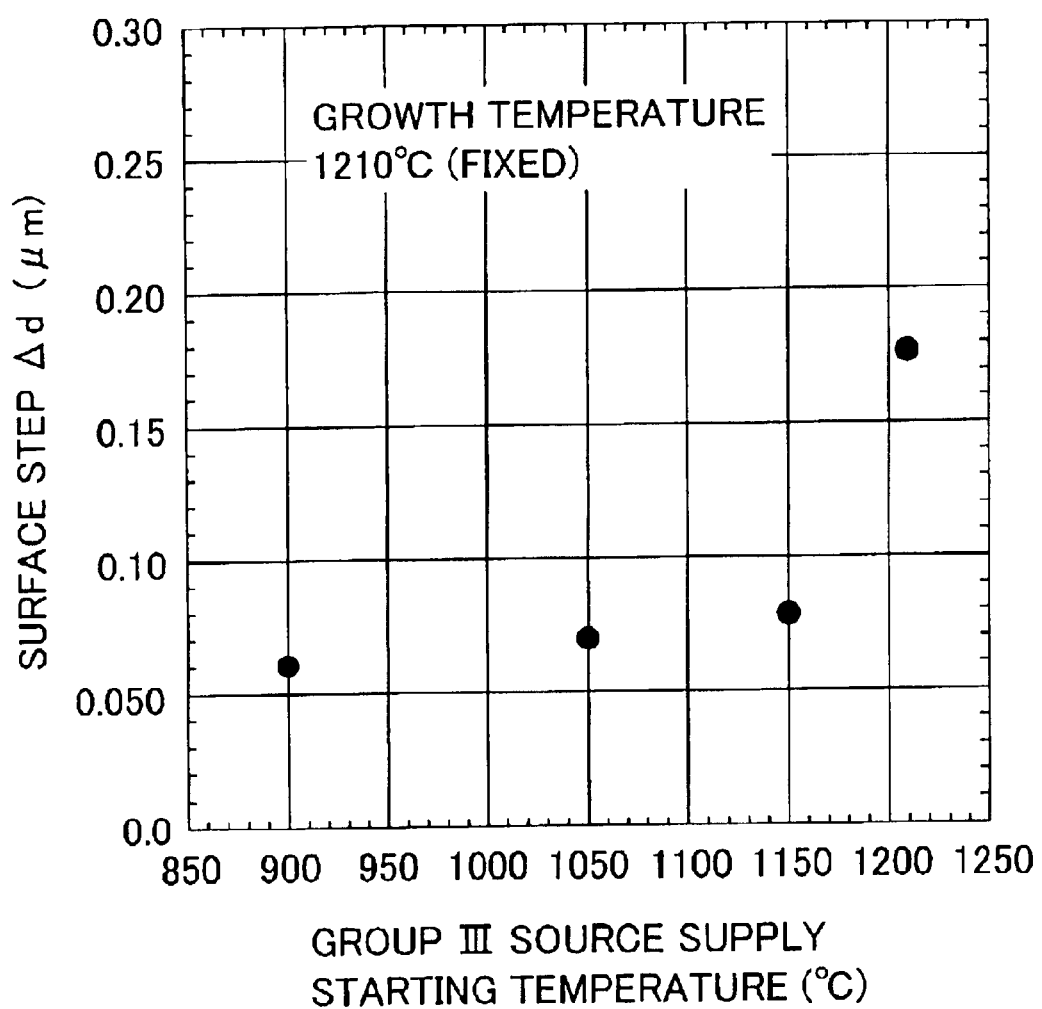
FIG. 7 is a graph showing TMG supply starting temperature versus surface roughness at a growth temperature Tg of 1210° C. in the first preferred embodiment of the present invention.
Figure 8:
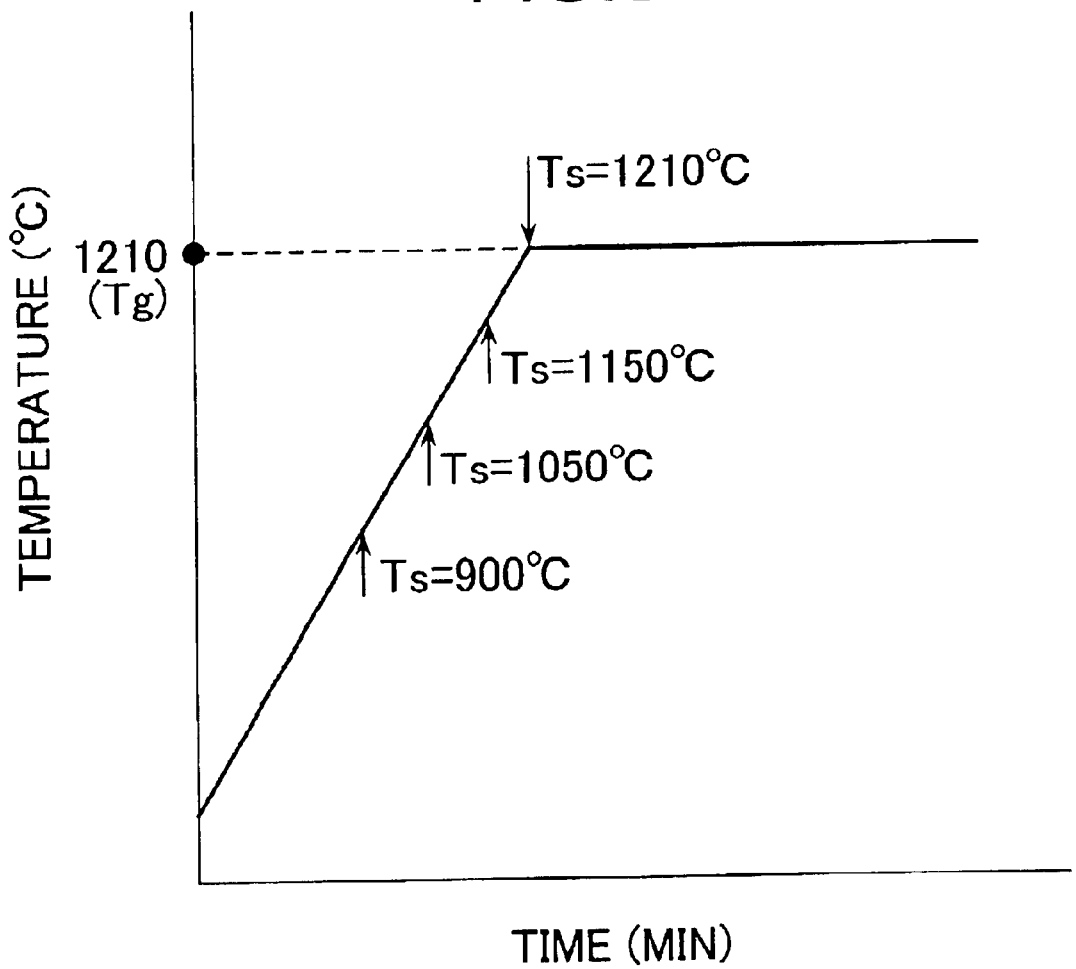
FIG. 8 shows a substrate temperature sequence used during nitride semiconductor growth to gather the data shown in the graph of FIG. 7.

On the other hand, FIG. 7 shows group III material supply starting temperature versus surface roughness (surface step) of nitride semiconductors formed on substrates W, when the growth temperature Tg was set at 1210° C. To gather the data plotted in FIG. 7, a temperature sequence shown in FIG. 8 was applied to the substrates W to grow the nitride semiconductors thereon. The TMG flows were started when the substrates W were at their group III material supply starting temperatures Ts=900° C., 1050° C., 1150° C. and 1210° C. during heating to their growth temperature (Tg=1210° C.).

The surface roughness is evaluated in FIGS. 5 and 7 as surface steps $\Delta d$ ($\mu m$) after measurement, using a surface step measuring instrument, of peak-to-valley distances in the individual nitride semiconductors (gallium nitride) grown on the substrates W to a thickness of 2 $\mu m$.

From the data in the graphs of FIGS. 5 and 7, it is verified that the nitride semiconductors having smaller surface steps Ad and thus satisfactory surface conditions were formed on the substrates W when the substrates were supplied with TMG (group III material) in a group III material supply starting temperature Ts range of 1200° C. or lower, or particularly, of 1150° C. or lower.

Figure 9:
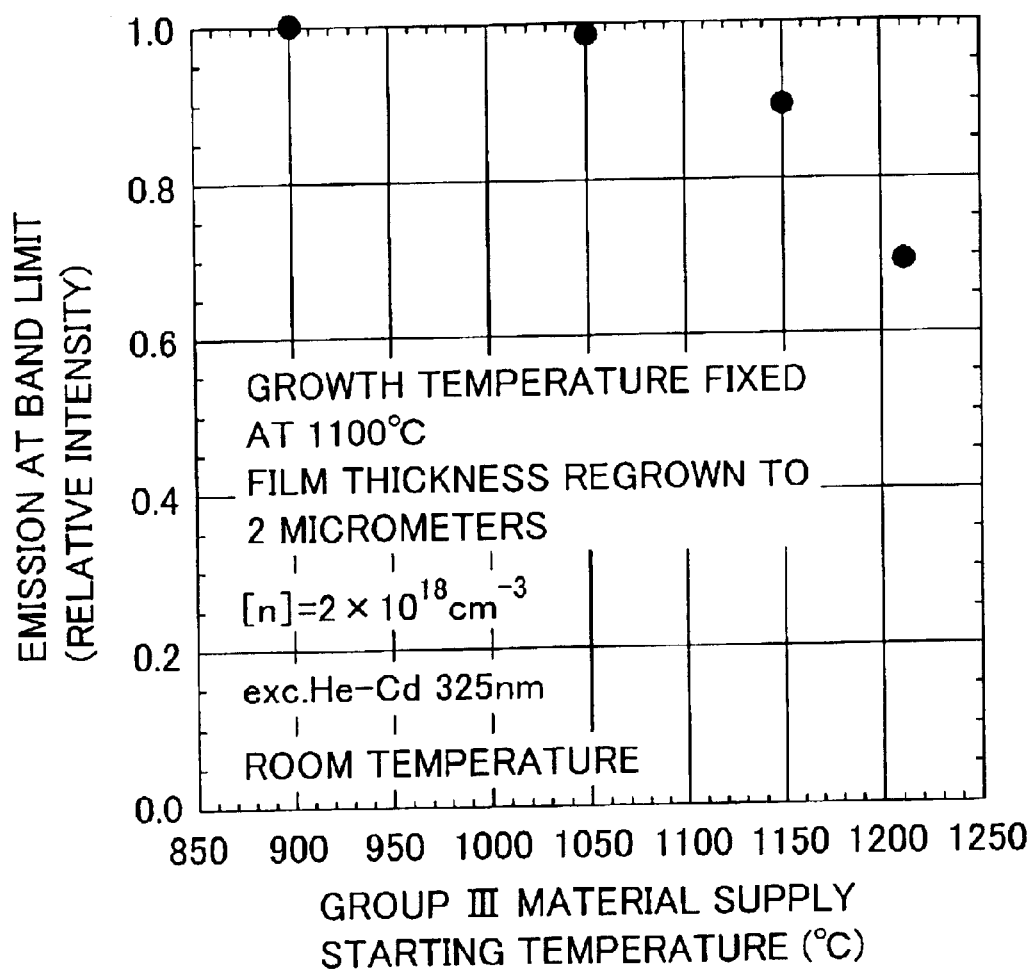
FIG. 9 is a graph showing TMG supply starting temperature versus emission intensity at a growth temperature Tg of 1100° C. in the first preferred embodiment of the present invention.

FIG. 9 shows TMG supply starting temperature Ts versus emission intensity of nitride semiconductors (gallium nitride) grown on substrates W. The emission intensity of each nitride semiconductor was measured as a function of the group III material supply starting temperature Ts when the growth temperature Tg was set at 1100° C. To gather the data plotted in FIG. 9, the same temperature sequence and group III material supply starting temperatures Ts as in FIG. 6 were applied to the substrates W for the gallium nitride growth. Nitride semiconductors each containing $2 \times 10^{18}$ atoms/cm$^3$ of silicon as their impurity were formed on the substrates W to a thickness of 2 $\mu m$, and measurements were made on these nitride semiconductors as to their photoluminescence intensity at room temperature, by exciting the nitride semiconductors using a He—Cd laser (whose wavelength is 325 nm). In FIG. 9, relative integrated photoluminescence intensity is shown as emission in relation to the intensity at TMG supply starting temperature=900° C. being 1.0.

Also, as seen in the graph of FIG. 9, the integrated photoluminescence intensities were higher at TMG supply starting temperatures of 1200° C. or less than in temperatures exceeding 1200° C. That is, the nitride semiconductors exhibited less nonradiative recombinations and thus satisfactory crystallinity when grown on the substrates W that were supplied with TMG at 1200° C. or lower. By contrast, in the TMG supply starting temperature range exceeding 1200° C., the integrated photoluminescence intensity was about 70% of that obtained when the TMG supply starting temperature was 900° C. Particularly, when the growth temperature Tg was set at 1100° C., adequate photoluminescence was observed at TMG supply starting temperatures of 1150° C. or less.

Here, on those nitride semiconductors formed by turning on the TMG flow before the substrate temperature exceeded 1200° C., a solid growth of atomic steps was observed using an atomic force microscope, clearly showing atomic-level surface flatness. In addition, from observations with a transmission electron microscope, few newly occurring defects were found at the interface between each substrate W and the nitride semiconductor grown thereon. This demonstrates that the nitride semiconductors obtained had satisfactory crystalline conditions. In contrast, the nitride semiconductor grown by initiating the TMG supply after the substrate temperature exceeded 1200° C. had atomic steps that were seen blurred through the atomic force microscope, with new defects occurring at its interface with the underlying substrate W.

Furthermore, in the above preferred embodiment of the present invention, to start the TMG flow after the substrate temperature reaches 300° C. means that TMG can be supplied after dissolution of ammonia as the nitrogen source, and this allows formation of nitride semiconductors with satisfactory Ga-N bonds. If the TMG flow begins after the substrate temperature reaches 400° C., then this advantage can be attained more reliably.

(Second Preferred Embodiment of the Present Invention)

Figure 10:
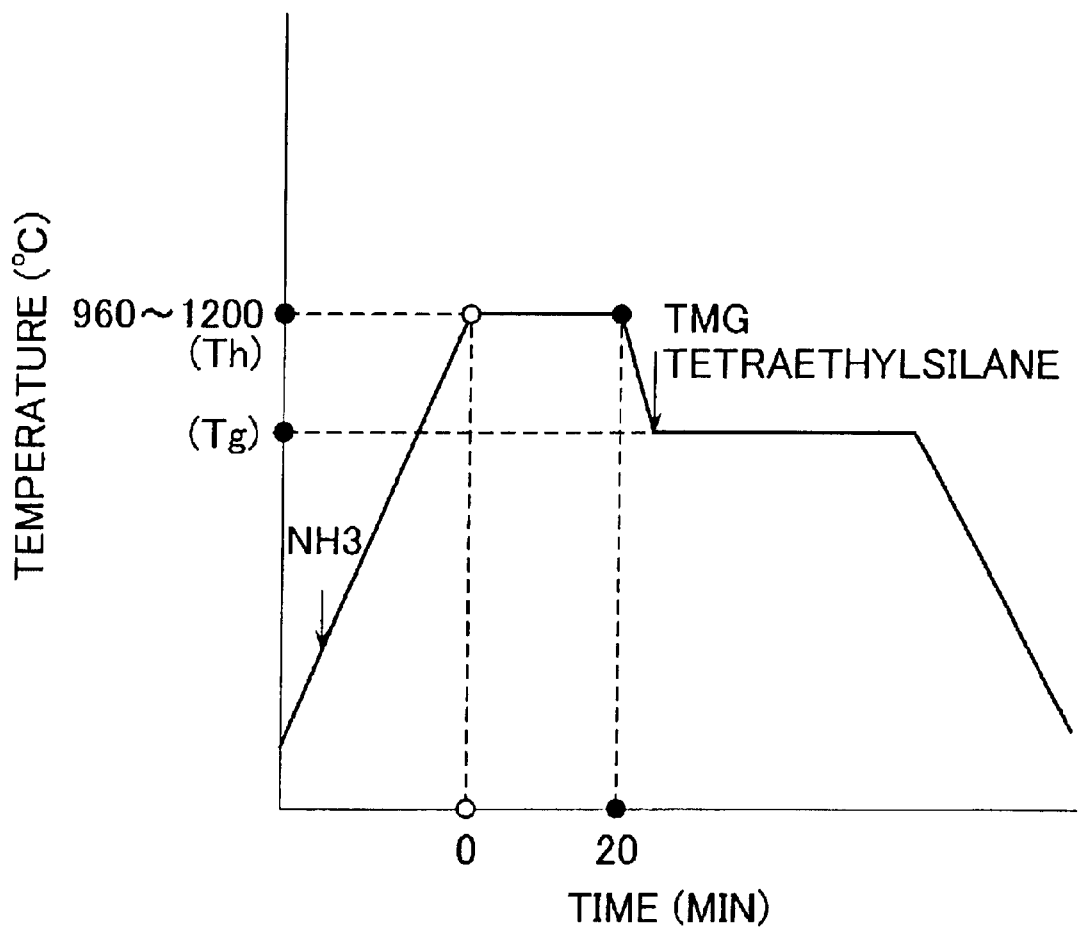
FIG. 10 is a graph showing a substrate temperature sequence for explaining a process of growing a nitride semiconductor according to a second preferred embodiment of the present invention.

FIG. 10 is a graph depicting a substrate temperature sequence as a function of source gas supply timing according to a second preferred embodiment of the present invention. Referring now to this graph and FIG. 1, another nitride semiconductor growth process will be described.

First, a substrate W is fixed on the susceptor 2 inside the reactor tube 1 of the MOCVD apparatus. The substrate W is a nitride semiconductor substrate made either of crystalline gallium nitride or by forming a crystalline gallium nitride layer on a substrate of a different type, such as sapphire.

Next, the ammonia gas supply into the reactor tube 1 is started together with heating the substrate W. The supply of the ammonia gas into the reactor tube 1 may be started with the reactor tube 1 at room temperature or after the substrate W is heated to a certain temperature.

In addition, the reactor tube 1 into which ammonia continuously flows, the substrate temperature is raised, for thermal cleaning, to a holding temperature Th not exceeding 1200° C., or preferably between 800 and 1200° C., or more preferably between 960 and 1200° C., for a prescribed time period. This prescribed time period, otherwise referred to as a holding time, which is defined as a time for performing thermal cleaning of the substrate W at the holding temperature Th, is selected as a function of the holding temperature Th so as to optimize the thermal cleaning. When the holding temperature Th is in the 800–1200° C. range, the holding time should not exceed 20 minutes.

Upon elapse of the holding time, the substrate temperature is adjusted to a growth temperature Tg (at which crystal growth can proceed stably for a certain time period), and a flow of TMG as the group III material (gallium source) is started. For example, to grow gallium nitride on the surface of a crystalline gallium nitride substrate W, the growth temperature Tg is set between 900 and 1300° C. The growth temperature Tg may be equal to or different from the holding temperature Th. Thus, the growth temperature Tg may not necessarily be lower than the holding temperature Th as in the case of FIG. 10, but may include cases where the holding temperature Th is equal to and higher than the growth temperature Th. In the case where the holding temperature Th equals the growth temperature Tg, the holding time should be an interval after the substrate is heated to and held at the holding temperature Th and before the TMG flow is started. That is, the substrate W is caused to wait for the holding time before nitride semiconductor growth starts thereon.

A flow of tetraethylsilane (silicon source) as an Si source impurity to the reactor tube 1 is started at the same time with the supply of TMG flow as a gallium source to the reactor tube 1.

Having started these supplies of TMG and tetraethylsilane into the reactor tube 1, a nitride semiconductor begins to grow on the substrate W. The required source gases (nitrogen and group III source gases) are supplied to the reactor tube 1 to initiate the nitride semiconductor growth on the substrate W surface in such a condition (monocrystalline, polycrystalline or amorphous) as determined by a material supply starting temperature, which is a substrate temperature at which to start supplying a relevant source gas onto the substrate. In other words, the introduction of the group III material to the substrate W initiates the nitride semiconductor growth on the substrate W, and hence a group III material supply starting temperature Ts corresponds to a growth starting temperature Ts. Although these temperatures are usually set to be different, the growth starting temperature (group III material supply starting temperature) Ts and the growth temperature Tg may be identical.

The source gas flow rates are set at, for example, 10 slm (standard liter/minute) for ammonia, 50 $\mu$mol/min for TMG, and $1.5 \times 10^{-3}$ $\mu$mol/min for tetraethylsilane.

After the start of the nitride semiconductor growth in this way, the crystalline nitride semiconductor substrate W has its temperature adjusted to the growth temperature Tg between 900 and 1300° C., and the source gas flows are continued. When the nitride semiconductor has grown to a prescribed thickness, the source gas flows are eliminated and the substrate temperature is reduced, to terminate a series of growth process steps. During the cooling, ammonia as the nitride source may continuously be supplied.

According to the above growth process, the crystalline nitride semiconductor substrate W is thermally cleaned at a temperature not exceeding 1200° C., while preventing desorption of the nitride semiconductor material from its surface. Thus, the thermal cleaning removes oxides from the substrate surface, while preventing desorption of the nitride semiconductor material therefrom to keep the substrate surface in satisfactory conditions, thereby allowing the nitride semiconductor growth to start on the optimized substrate surface.

Moreover, by performing the thermal cleaning at holding temperatures Th from 800 to 1200° C. and preferably from 960 to 1200° C., the thermal cleaning efficiency can be improved. Furthermore, by holding the substrate W in the above holding temperature ranges for a holding time not longer than 20 minutes, desorption of the nitride semiconductor material from the surface layer of the substrate due to excessively long thermal cleaning can be prevented.

Furthermore, by setting the source gas supply starting temperature for TMG and tetraethylsilane, or the growth temperature Tg in a range not exceeding 1200° C., desorption of the nitride semiconductor material from the surface layer of the substrate W can be prevented.

Figure 11:
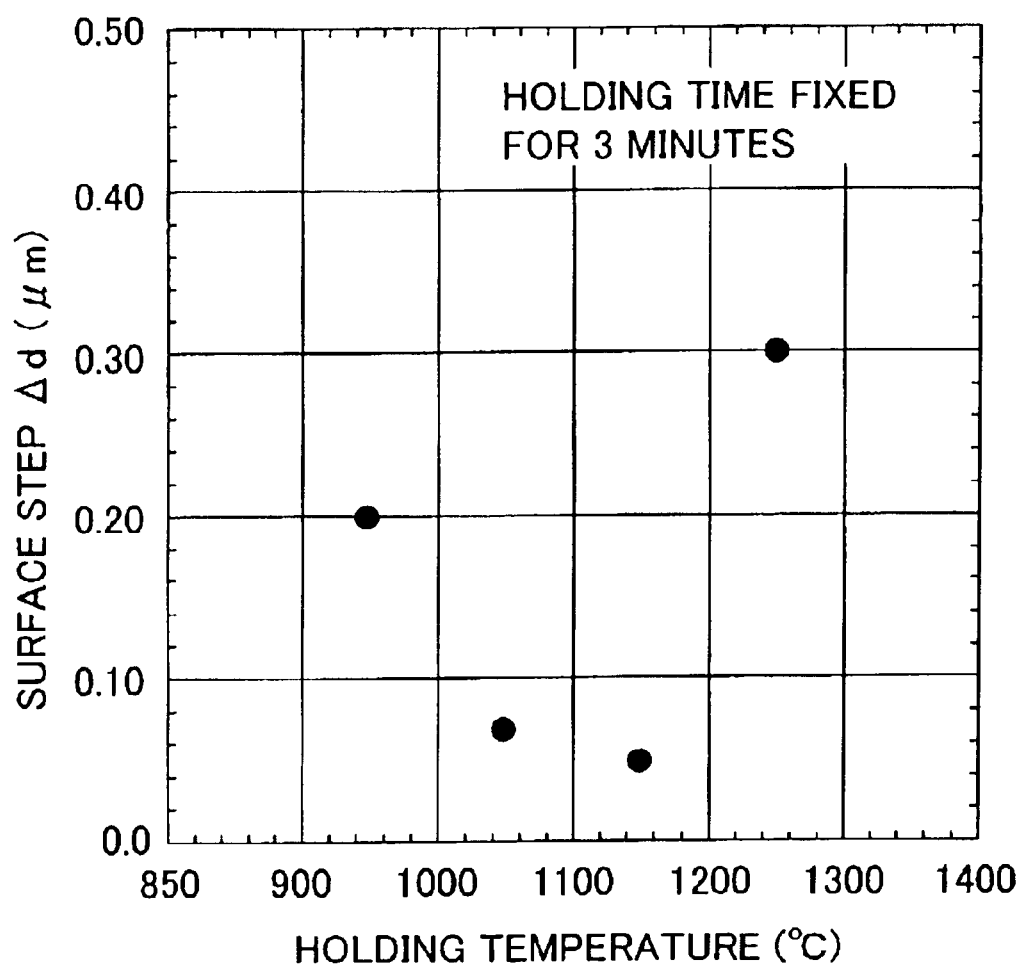
FIG. 11 is a graph showing holding temperature Th versus surface roughness for a holding time of 3 minutes in the second preferred embodiment of the present invention.
Figure 12:
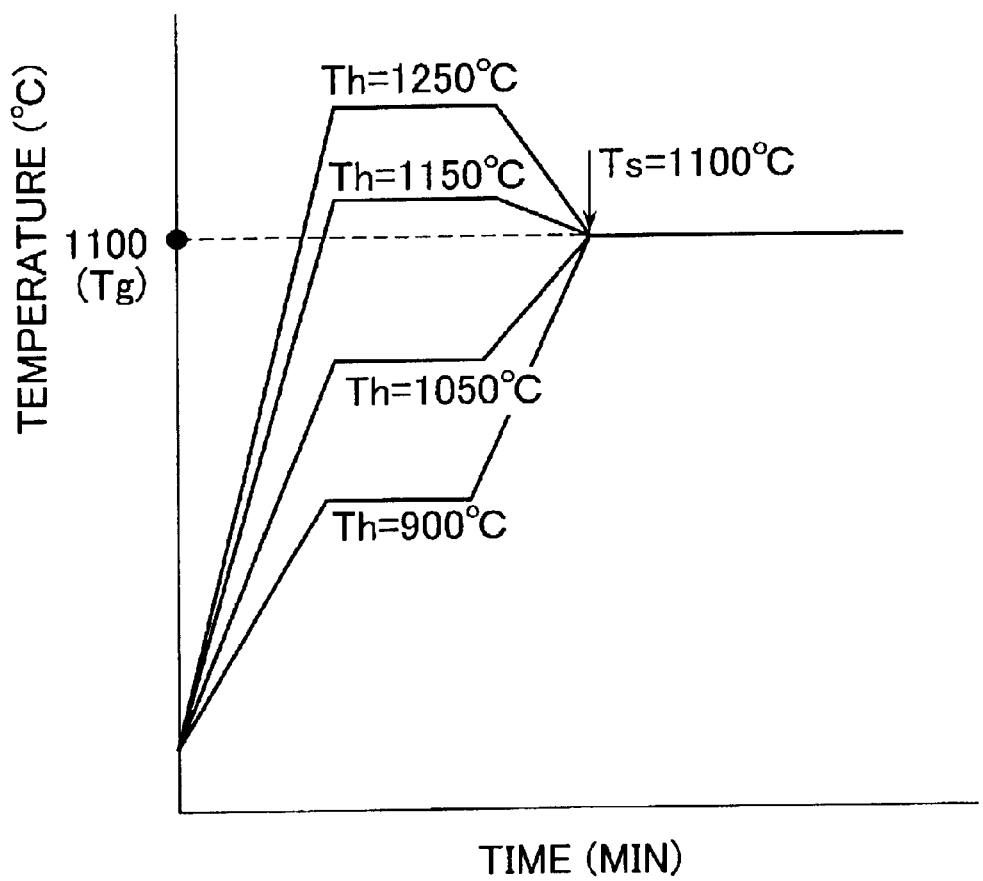
FIG. 12 shows a substrate temperature sequence used during nitride semiconductor growth to gather the data shown in the graph of FIG. 11.

FIG. 11 shows holding temperature Th versus surface roughness (surface step) of nitride semiconductors formed on substrates W. To gather the data plotted in FIG. 11, a temperature sequence shown in FIG. 12 was applied to the substrates W to grow the nitride semiconductors thereon. After heated to and then held at respective holding temperatures Th for 3 minutes, the substrates W had their temperatures adjusted to a growth temperature Tg=1100° C. to turn on TMG and tetraethylsilane gas flows for growing the nitride semiconductors (gallium nitride) thereon. As to the resultant 2 $\mu$m thick nitride semiconductors, their surface steps $\Delta$d ($\mu$m) were measured as peak-to-valley distances using the surface step measuring instrument.

From the graph of FIG. 11, it is verified that when the holding time was fixed for 3 minutes, the nitride semiconductors having small surface steps $\Delta$d and hence satisfactory surface conditions were formed on the substrates W that were held at the holding temperatures Th not exceeding 1200° C. Especially, on those substrates W whose holding temperatures Th were in the 960–1200° C. range, the nitride semiconductors had surface steps $\Delta$d of 0.10 $\mu$m or less, exhibiting optimum surface conditions.

This demonstrates that when thermally cleaned for 3 minutes, the substrates held at the holding temperatures Th not exceeding 1200° C. produced nitride semiconductors having satisfactory surface conditions, with the substrate surfaces prevented from becoming rough due to high-temperature cleaning and with oxides removed from such substrate surfaces.

Moreover, when the holding time was set for 3 minutes, those nitride semiconductors formed on the substrates W that were held at the holding temperatures Th not exceeding 1200° C. exhibited a solid growth of atomic steps through the atomic force microscope, clearly showing their surface flatness at the atomic level. In addition, from observations using the transmission electron microscope, few newly occurring defects were found at the interface between each substrate W and the nitride semiconductor grown thereon, thus attesting to the fact that the nitride semiconductors obtained had satisfactory crystalline conditions. In contrast, the nitride semiconductor grown on the substrate W that was thermally cleaned at 1250° C. as the holding temperature Th had atomic steps that were seen blurred through the atomic force microscope, with new defects occurring at its interface with the underlying substrate W.

Figure 13:
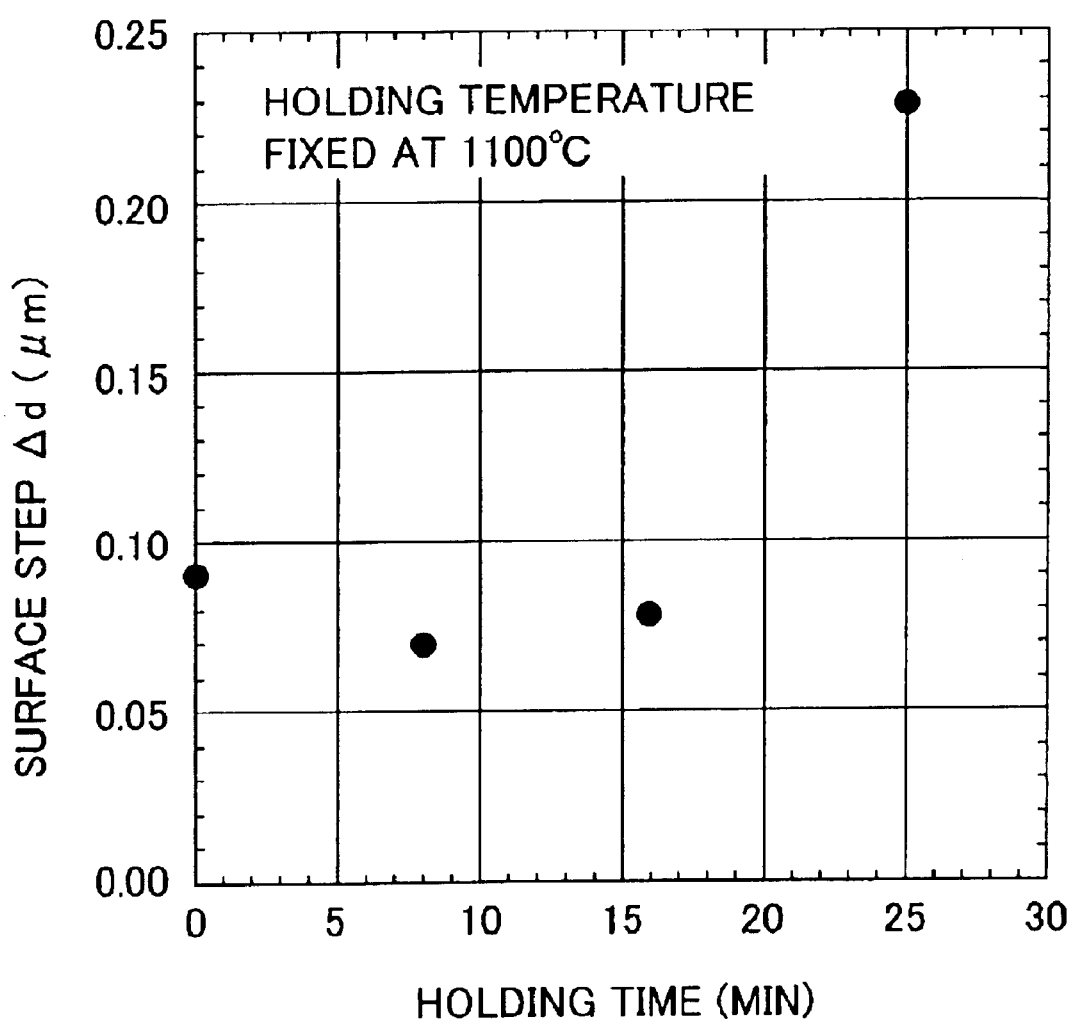
FIG. 13 is a graph showing holding time versus surface roughness at a holding temperature Th of 1100° C. in the second preferred embodiment of the present invention.
Figure 14:
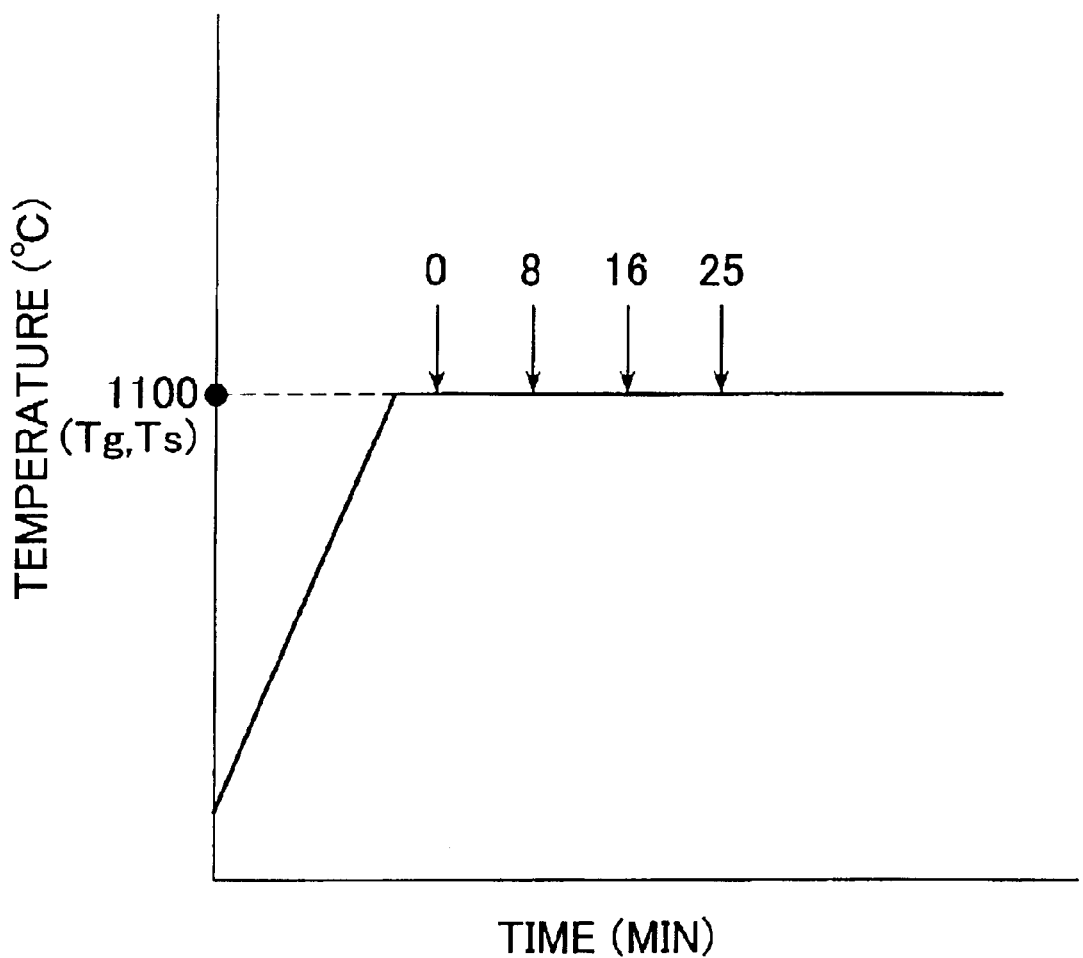
FIG. 14 shows a substrate temperature sequence used during nitride semiconductor growth to gather the data shown in the graph of FIG. 13.

FIG. 13 shows holding time versus surface roughness (surface step) of nitride semiconductors formed on substrates W. To gather the data plotted in FIG. 13, a temperature sequence shown in FIG. 14 was applied to the substrates W to grow the nitride semiconductors thereon. After heated to a holding temperature Th (=1100° C.) and then held at that temperature Th for respective holding times, the substrates had their temperature adjusted to (i.e., continuously held at) the growth temperature Tg=1100° C. for turning on TMG and tetraethylsilane gas flows to grow the nitride semiconductors thereon. As to the resultant 2 $\mu$m thick nitride semiconductors, their surface steps $\Delta$d ($\mu$m) were measured as peak-to-valley distances using the surface step measuring instrument.

From the graph of FIG. 13, it is verified that the nitride semiconductors having small surface steps Ad and thus satisfactory surface conditions were formed on the substrates W that were thermally cleaned for the holding times not exceeding 20 minutes after held at 1100° C.

This demonstrates that with the holding temperature Th fixed at 1100° C. and starting supply of TMG, the substrate surfaces thermally cleaned for a duration not exceeding 20 minutes grew thereon the nitride semiconductors having satisfactory surface conditions, with the substrate surfaces prevented from becoming rough due to high-temperature cleaning (thermal cleaning) and with oxides removed from such substrate surfaces.

Moreover, those nitride semiconductors formed on the substrates W held for holding times not longer than 20 minutes after having reached the above fixed holding temperature exhibited a solid growth of atomic steps through the atomic force microscope, clearly showing their surface flatness at the atomic level. In addition, from observations through the transmission electron microscope, few newly occurring defects were found at the interface between each substrate W and the nitride semiconductor grown thereon. This attests to the fact that the obtained nitride semiconductors had satisfactory crystalline conditions. In contrast, the nitride semiconductor grown on the substrate W that was thermally cleaned for a holding time of 25 minutes had atomic steps that were seen blurred through the atomic force microscope, with new defects occurring at its interface with the underlying substrate W.

As a result, in the process of growing a nitride semiconductor according to the second preferred embodiment of the present invention, a nitride semiconductor having satisfactory surface crystallinity can be grown on a crystalline substrate W whose surface is flat with oxides removed by thermal cleaning, without introduction of newly occurring defects at its interface with the underlying substrate W. This nitride semiconductor is hence suitable for light-emitting and light-receiving device applications.

It is to be noted that the above preferred embodiments of the present invention refer to the growth of nitride semiconductors made of gallium nitride on substrates made of crystalline gallium nitride. The application of the present invention is not limited to these preferred embodiment of the present invention in which growing nitride semiconductors and their underlying substrates are of the same composition. For example, a substrate and a nitride semiconductor grown on the substrate may be of any composition as long as they are made of nitride semiconductors having a crystalline layer comprising group III metals and a nitride, which are represented by the general formula $B_uAl_xGa_yIn_zN$ ($0 \leq u \leq 1$, $0 \leq x \leq 1$, $0 \leq y \leq 1$, $0 \leq z \leq 1$, $u+x+y+z=1$), and they can provide similar advantages.

Some specific examples are $Al_xGa_{1-x}N$ ($0 \leq x \leq 1$), InGaN and AlGaInN semiconductors and other nitride semiconductors containing group V elements including As and P may also be acceptable in some cases.

The above preferred embodiments of the present invention have been described with reference to the direct growth of nitride semiconductors on crystalline nitride semiconductor substrates. However, the present invention may be applicable similarly to other processes for selectively growing a nitride semiconductor on a pattern of, e.g., silicon dioxide ($SiO_2$) formed on a nitride semiconductor substrate, which can also provide similar advantages.

The nitride semiconductors fabricated by the above processes allow formation of a main portion of semiconductor devices thereon, the semiconductor devices including basically any devices using nitride semiconductors. Some specific examples include, but are not limited to, semiconductor lasers, semiconductor light-emitting devices such as light-emitting diodes, and high electron mobility devices such as FETs and heterojunction bipolar transistors.

Although the invention has been described hereinabove in its preferred form with a certain degree of particularity, other changes, variations, combinations and sub-combinations are possible therein. It is therefore to be understood that many modifications will be practiced otherwise than as specifically described herein without departing form the scope and spirit of the present invention.

What is claimed is:

1. A process of growing a nitride semiconductor on a crystalline nitride semiconductor substrate, comprising the steps of:

starting a supply of a nitrogen source gas from among source gases onto a surface of said substrate before or after heating said substrate, starting growth of said nitride semiconductor on said substrate by starting a supply of a second source gas from among said source gases that differs from said nitrogen source gas before the temperature of said substrate exceeds 1200° C., said second source gas being supplied onto the surface of said substrate while heating said substrate is being heated.

2. A process according to claim 1, wherein said second source gas is supplied after the temperature of said substrate has reached 300° C.

3. A process according to claim 2, wherein said nitride semiconductor comprises $Al_xGa_{1-x}N(0 \leq x \leq 1)$.

4. A process according to claim 1, wherein said second source gas from among said source gases comprises a group III source gas.

5. A process according to claim 4, wherein said nitride semiconductor comprises $Al_xGa_{1-x}N(0 \leq x \leq 1)$.

6. A process according to claim 1, wherein said substrate comprises gallium nitride.

7. A process of growing a nitride semiconductor on a crystalline nitride semiconductor substrate, comprising the steps of:

starting a supply of a nitrogen source gas from among source gases onto a surface of said substrate before or after heating said substrate, submitting said surface of said substrate to thermal cleaning by heating said substrate to a temperature not exceeding 1200° C., starting growth of said nitride semiconductor on said substrate after said thermal cleaning by starting a supply of a second source gas from among said source gases that differs from said nitrogen source gas before the temperature of said substrate exceeds 1200° C., said second source gas being supplied onto the surface of said substrate while said substrate is being heated.

8. A process according to claim 7, wherein said thermal cleaning is performed while said substrate is held at a prescribed temperature range not exceeding 1200° C.

9. A process according to claim 8, wherein said nitride semiconductor comprises $Al_xGa_{1-x}N(0 \leq x \leq 1)$.

10. A process according to claim 7, wherein said thermal cleaning is performed while nitrogen source gas is continuously supplied onto said surface of said substrate.

11. A process according to claim 7, wherein said second source gas from among said source gases comprises a group III source gas.

12. A process according to claim 11, wherein said nitride semiconductor comprises $Al_xGa_{1-x}N(0 \leq x \leq 1)$.

13. A process according to claim 7, wherein said substrate comprises gallium nitride.

* * * * *

UNITED STATES PATENT AND TRADEMARK OFFICE
CERTIFICATE OF CORRECTION

PATENT NO. : 6,730,611 B2
DATED : May 4, 2004
INVENTOR(S) : Katsunori Yanashima

It is certified that error appears in the above-identified patent and that said Letters Patent is hereby corrected as shown below:

Title page,
Item [57], ABSTRACT,
Line 5, "1200°C.," should read -- 1200°C, --.

Column 12,
Line 16, delete "heating".

Signed and Sealed this

Twenty-third Day of November, 2004

JON W. DUDAS
*Director of the United States Patent and Trademark Office*